(12) United States Patent
Steur et al.

(10) Patent No.: US 12,315,756 B2
(45) Date of Patent: May 27, 2025

(54) METHOD OF MANUFACTURING A SUBSTRATE SUPPORT FOR A LITHOGRAPHIC APPARATUS, SUBSTRATE TABLE, LITHOGRAPHIC APPARATUS, DEVICE MANUFACTURING METHOD, METHOD OF USE

(71) Applicant: ASML NETHERLANDS B.V., Veldhoven (NL)

(72) Inventors: Michael Marinus Anna Steur, Eindhoven (NL); Nicolaas Ten Kate, Almkerk (NL); Siegfried Alexander Tromp, Knegsel (NL); Koen Gerhardus Winkels, Schijndel (NL); Antonius Franciscus Johannes De Groot, Lierop (NL)

(73) Assignee: ASML NETHERLANDS B.V., Veldhoven (NL)

( * ) Notice: Subject to any disclaimer, the term of this patent is extended or adjusted under 35 U.S.C. 154(b) by 428 days.

(21) Appl. No.: 17/778,054

(22) PCT Filed: Nov. 20, 2020

(86) PCT No.: PCT/EP2020/082988
§ 371 (c)(1),
(2) Date: May 19, 2022

(87) PCT Pub. No.: WO2021/115765
PCT Pub. Date: Jun. 17, 2021

(65) Prior Publication Data
US 2023/0004092 A1 Jan. 5, 2023

(30) Foreign Application Priority Data

Dec. 9, 2019 (EP) .................................... 19214460
Jul. 3, 2020 (EP) .................................... 20183998

(51) Int. Cl.
*H01L 21/687* (2006.01)
(52) U.S. Cl.
CPC .... *H01L 21/6875* (2013.01); *H01L 21/68785* (2013.01)
(58) Field of Classification Search
CPC .................... H01L 21/6875; H01L 21/68785
See application file for complete search history.

(56) References Cited

U.S. PATENT DOCUMENTS

| 6,952,253 B2 | 10/2005 | Lof et al. |
| 10,453,734 B2 | 10/2019 | Poiesz et al. |

(Continued)

FOREIGN PATENT DOCUMENTS

| CN | 111213093 A | * 5/2020 | ......... G03F 7/70341 |
| JP | 11-163107 | 6/1999 | |

(Continued)

OTHER PUBLICATIONS

"Chapter 7, Microfiltration", Nano and Micro Engineered Membrane Technology, vol. 10, pp. 169-253 (2004).

(Continued)

*Primary Examiner* — Eric A. Gates
(74) *Attorney, Agent, or Firm* — Pillsbury Winthrop Shaw Pittman, LLP

(57) ABSTRACT

Substrate tables and methods of manufacturing substrate supports for substrate tables. In one arrangement, a plurality of holes are formed through a base member. A burl formation member is joined to the base member. A plurality of burl structures are formed in the burl formation member. Each burl structure includes a distal surface that contacts, in use, a substrate being supported. Each burl structure has an opening to at least one of the holes formed through the base member.

20 Claims, 12 Drawing Sheets

(56) References Cited

U.S. PATENT DOCUMENTS

| | | | |
|---|---|---|---|
| 10,527,092 B2 | 1/2020 | Tromp et al. | |
| 11,201,079 B2* | 12/2021 | Liao | H01L 21/6875 |
| 11,874,607 B2* | 1/2024 | Nikipelov | H01L 21/68757 |
| 2009/0086187 A1 | 4/2009 | Compen et al. | |
| 2010/0220425 A1 | 9/2010 | Yonekura et al. | |
| 2011/0280703 A1 | 11/2011 | Cadee et al. | |
| 2017/0292566 A1 | 10/2017 | Tromp et al. | |
| 2018/0190534 A1 | 7/2018 | Poiesz et al. | |
| 2019/0187571 A1 | 6/2019 | Janssens et al. | |

FOREIGN PATENT DOCUMENTS

| | | |
|---|---|---|
| JP | 2002-313896 | 10/2002 |
| JP | 2010-205813 | 9/2010 |
| JP | 2017-533454 | 11/2017 |
| JP | 2018-521344 | 8/2018 |
| TW | 201923481 | 6/2019 |
| WO | 2008/156366 | 12/2008 |
| WO | 2008/156367 | 12/2008 |
| WO | 2016/062540 | 4/2016 |
| WO | 2019/081174 | 5/2019 |

OTHER PUBLICATIONS

Y. S. Kim et al., "Ultra thinning 300-mm wafer down to 7-μm for 3D wafer Integration on 45-nm node CMOS using strained silicon and Cu/Low-k interconnects," *2009 IEEE International Electron Devices Meeting (IEDM)*, pp. 1-4 (2009).

International Search Report dated Mar. 2, 2021, issued in corresponding International Application No. PCT/EP2020/082988 (3 pgs.).

Written Opinion of the International Searching Authority dated Mar. 2, 2021, issued in corresponding International Application No. PCT/EP2020/082988 (7 pgs.).

* cited by examiner

METHOD OF MANUFACTURING A SUBSTRATE SUPPORT FOR A LITHOGRAPHIC APPARATUS, SUBSTRATE TABLE, LITHOGRAPHIC APPARATUS, DEVICE MANUFACTURING METHOD, METHOD OF USE

CROSS REFERENCE TO RELATED APPLICATIONS

This application is the U.S. national phase entry of PCT Patent Application No. PCT/EP2020/082988, filed on Nov. 20, 2020, which is claims the benefit of priority to European Application No. 19214460.8, filed Dec. 9, 2019 and of European Application No. 20183998.2-, filed Jul. 3, 2020, both of which are incorporated herein in their entireties by reference.

FIELD

The present invention relates to manufacturing a substrate support for a lithographic apparatus, to a substrate table having the substrate support, to a lithographic apparatus having the substrate table, to a device manufacturing method using the lithographic apparatus, and to a method of using the substrate table.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as "Moore's law". To keep up with Moore's law the semiconductor industry is seeking technologies that make it possible to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

A lithographic apparatus may include an illumination system for providing a projection beam of radiation, and a support structure for supporting a patterning device. The patterning device may serve to impart the projection beam with a pattern in its cross-section. The apparatus may also include a projection system for projecting the patterned beam onto a target portion of a substrate.

In a lithographic apparatus the substrate to be exposed (which may be referred to as a production substrate) may be held on a substrate table (sometimes referred to as a wafer table or substrate holder). The substrate table may be moveable with respect to the projection system. A substrate-facing surface of the substrate table may be provided with a plurality of projections (referred to as burls). The distal surfaces of the burls may conform to a flat plane and support the substrate. The burls can provide several advantages: a contaminant particle on the substrate table or on the substrate is likely to fall between burls and therefore does not cause a deformation of the substrate; it is easier to machine the burls so their ends conform to a plane than to make the surface of the substrate table flat; and the properties of the burls can be adjusted, e.g. to control clamping of the substrate to the substrate table.

Production substrates may become distorted due to frictional forces between the burls and the substrate. These interactions can be reduced by driving fluid through the burls to provide a lubricating effect. It has proven challenging to drive fluid through a large number of burls uniformly and reliably.

SUMMARY

An object of the present invention is to improve manufacture and/or performance of substrate supports.

According to an aspect of the invention, there is provided a substrate table configured to support a substrate during a lithography process, comprising: a substrate support comprising: a plurality of holes extending through a base member of the substrate support; and a plurality of burl structures, wherein: each burl structure comprises a distal surface configured to contact, in use, a substrate being supported by the substrate support, and each burl structure comprises openings to at least two of the holes in the base member; and the substrate table is configured to provide an outward flow of fluid through all of the openings in each of one or more of the burl structures.

According to a further aspect, there is provided a method of manufacturing a substrate support for a lithographic apparatus, comprising: forming a plurality of holes through a base member; joining a burl formation member to the base member after the holes have been formed in the base member; and forming a plurality of burl structures in the burl formation member after the burl formation member has been joined to the base member, thereby forming the substrate support, wherein the burl structures are formed such that: each burl structure comprises a distal surface configured to contact, in use, a substrate being supported by the substrate support, and each burl structure comprises an opening to at least one of the holes formed through the base member.

According to a further aspect, there is provided a method of manufacturing a substrate support for a lithographic apparatus, comprising: forming a plurality of holes through a base member; joining a burl formation member to the base member after the holes have been formed in the base member; and forming a plurality of burl structures in the burl formation member, wherein the burl structures are formed such that: each burl structure comprises a distal surface configured to contact, in use, a substrate being supported by the substrate support, and each burl structure comprises an opening to at least one of the holes formed through the base member.

According to a further aspect, there is provided a method of manufacturing a substrate support for a lithographic apparatus, comprising: forming a plurality of holes through a base member; and forming a plurality of burl structures in the base member after at least a portion of each of the plurality of holes has been formed in the base member, wherein the burl structures are formed such that: each burl structure comprises a distal surface configured to contact, in use, a substrate being supported, and each burl structure comprises an opening to at least one of the holes formed through the base member.

Further embodiments, features and advantages of the present invention are described in detail below with reference to the accompanying drawings.

BRIEF DESCRIPTION OF THE DRAWINGS

Embodiments of the invention will now be described by way of example only, with reference to the accompanying schematic drawings in which corresponding reference symbols indicate corresponding parts, and in which.

The features shown in the figures are not necessarily to scale, and the size and/or arrangement depicted is not limiting. It will be understood that the figures include optional features which may not be essential to the invention.

DETAILED DESCRIPTION

In the present document, the terms "radiation" and "beam" are used to encompass all types of electromagnetic radiation, including ultraviolet radiation (e.g. with a wavelength of 436, 405, 365, 248, 193, 157, 126 or 13.5 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
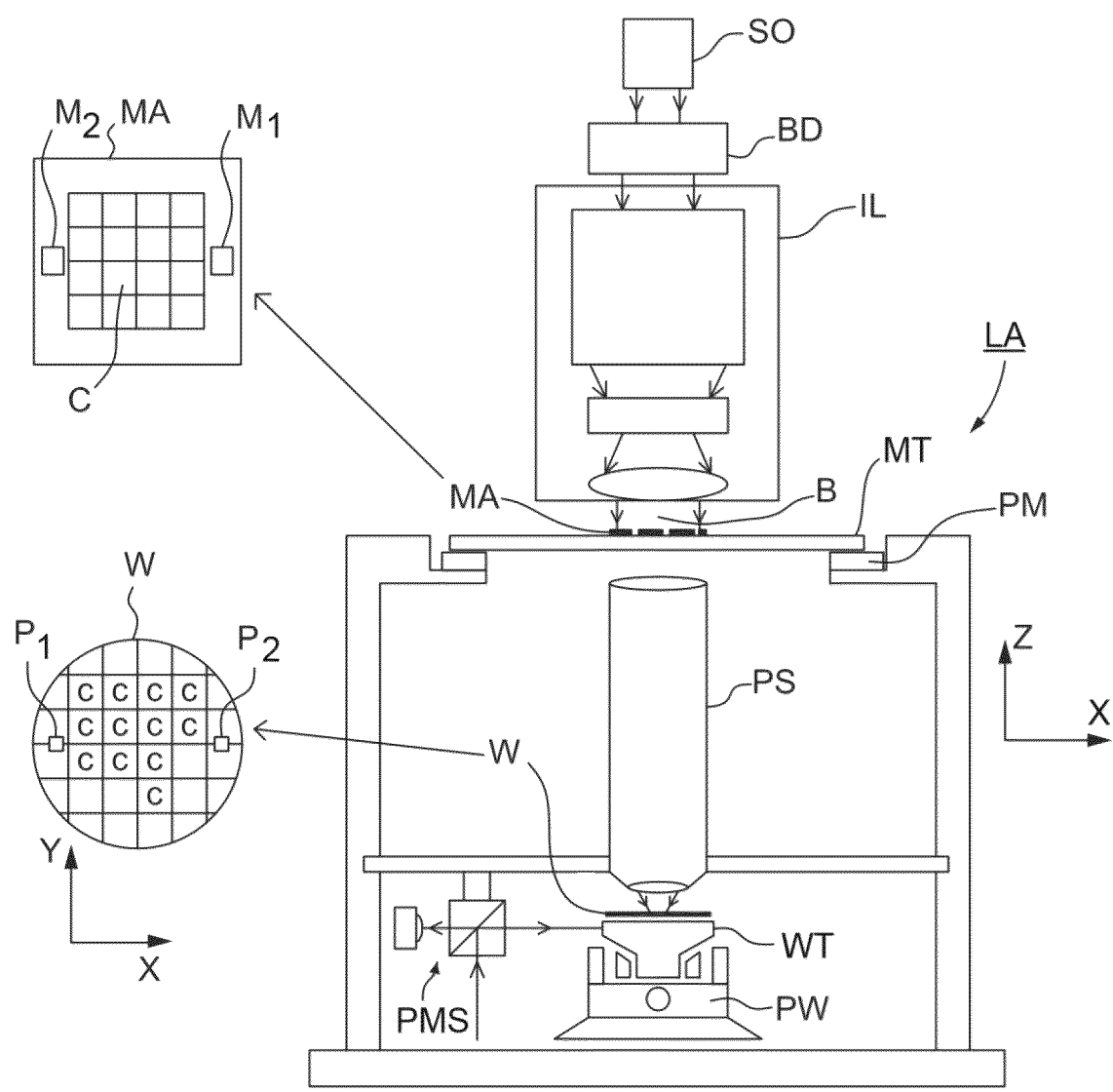
FIG. 1 schematically depicts an overview of a lithographic apparatus.

FIG. 1 schematically depicts a lithographic apparatus LA. The lithographic apparatus includes an illumination system (also referred to as illuminator) IL configured to condition a radiation beam B (e.g., EUV radiation or DUV radiation), a mask support (e.g., a mask table) MT constructed to support a patterning device (e.g., a mask) MA and connected to a first positioner PM configured to accurately position the patterning device MA in accordance with certain parameters, a substrate table WT constructed to hold a substrate (e.g., a resist coated wafer) W and connected to a second positioner PW configured to accurately position the substrate table WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate W may be covered by an immersion liquid having a relatively high refractive index, e.g., water, so as to fill an immersion space between the projection system PS and the substrate W— which is also referred to as immersion lithography. More information on immersion techniques is given in U.S. Pat. No. 6,952,253, which is incorporated herein by reference.

The lithographic apparatus may be of a type having two or more substrate tables WT (also named "dual stage"). In such "multiple stage" machine, the substrate tables WT may be used in parallel, and/or steps in preparation of a subsequent exposure of the substrate W may be carried out on the substrate W located on one of the substrate table WT while another substrate W on the other substrate table WT is being used for exposing a pattern on the other substrate W.

In addition to the substrate table WT, the lithographic apparatus may comprise a measurement stage (not depicted in FIG. 1). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate table WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system PMS, the substrate table WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In this specification, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In a lithographic apparatus it is necessary to position with great accuracy the upper surface of a substrate to be exposed in the plane of best focus of the aerial image of the pattern projected by the projection system. To achieve this, the substrate can be held on a substrate table. The surface of the substrate table that supports the substrate can be provided with a plurality of burls whose distal ends can be coplanar in a nominal support plane. The burls, though numerous, may be small in cross-sectional area parallel to the support plane so that the total cross-sectional area of their distal ends is a few percent, e.g. less than 5%, of the surface area of the substrate. The gas pressure in the space between the substrate table and the substrate may be reduced relative to the pressure above the substrate to create a force clamping the substrate to the substrate table. Alternatively or additionally, an electrostatic clamping force may be used to clamp the substrate to the substrate table.

When a substrate is loaded onto a substrate table, the substrate generally does not land perfectly flat on the substrate table. This means that during loading of a substrate, one point of the substrate tends to make contact with at least one of the burls and then the rest of the substrate comes into contact with the substrate table. Frictional forces between the substrate and the substrate table during loading may lead to in-plane deformation in the substrate as the substrate makes contact across the substrate table. Similar effects may occur during unloading. The in-plane deformation can increase overlay errors.

It is possible to reduce frictional forces between burls and the substrate by driving fluid (e.g. either or both of a gas and a liquid) through the burls to provide a lubricating effect. It is difficult to provide such a lubricating fluid flow uniformly because unwanted variations in flow resistance between different burls will cause corresponding variations in flow rate through the burls. The flow rate will be larger where the flow resistance is smaller and vice versa.

One approach to reducing the above problem is to provide flow restrictions in each burl to increase the flow resistance in each burl in a controlled way. The increased flow resistances of the buds makes it possible to reliably ensure a sufficient flow out of each burl without having excessive flow through any of the burls or an excessive overall flow.

Embodiments described below provide efficient and/or reliable methods of manufacturing a substrate support having burls (referred to below as burl structures) with such flow restrictions.

Figure 2:
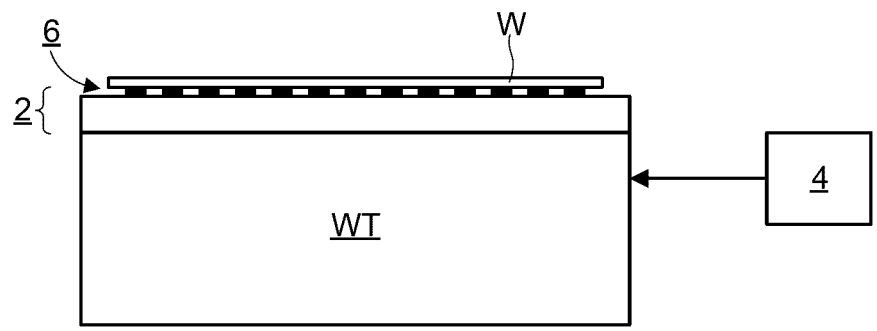
FIG. 2 schematically depicts a substrate table having a substrate support with burl structures.

FIG. 2 depicts a substrate support 2 attached to an upper surface of a substrate table WT. The support table WT provides relative movement between a substrate W and a projection system PS of a lithographic apparatus LA during exposure of the substrate W in a lithography process performed by the lithographic apparatus LA. The lithographic apparatus LA may be used in a method of manufacturing a device, such as a semiconductor device. The substrate table WT and/or lithographic apparatus LA may be configured and/or arranged to operate in any of the ways described above with reference to FIG. 1.

Figure 3:
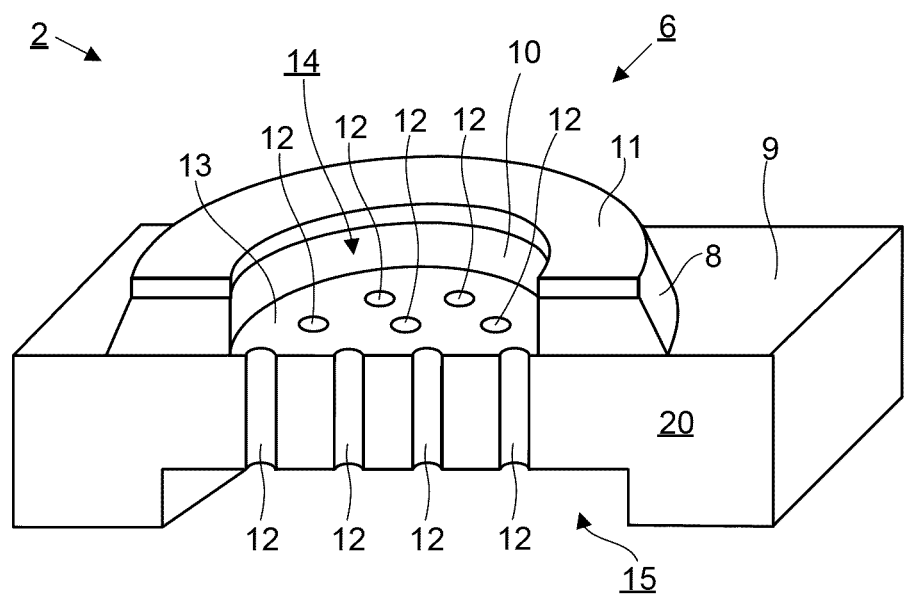
FIG. 3 schematically depicts a sectional perspective view of a burl structure of a substrate support.

The substrate support 2 comprises a plurality of burl structures 6. FIG. 3 depicts an example burl structure 6 in more detail. Each burl structure 6 comprises a distal surface 11. In use, the distal surface 11 contacts a substrate W supported by the substrate support 2. For planar substrates, the distal surfaces 11 of the burl structures 6 may be coplanar.

In the embodiment shown, a burl recess 14 extends from the distal surface 11 to a recessed surface 13 in each burl structure 6. In the example of FIG. 3, the burl recess 14 is substantially cylindrical. An axis of cylindrical symmetry of the burl recess 14 is perpendicular to a substrate W supported by the burl structure 6 in use. The burl recess 14 defines a channel through which fluid (e.g. liquid and/or gas) can flow in use to provide the lubricating effect mentioned above. In some embodiments, as exemplified in FIG. 3, each of one or more of the burl structures 6 comprises a wall surrounding the burl recess 14 in directions parallel to a plane of a supported substrate W in use. A distal portion of the wall forms all or a portion of the distal surface 11 that contacts the supported substrate W in use. The wall has a radially outer surface 8 facing away from the burl recess 14. In the embodiment shown, the radially outer surface 8 is tapered. Tapering the radially outer surface 8 may strengthen the wall relative to alternative configurations in which the radially outer surface 8 is not tapered. The wall has a radially inner surface 10 facing into the burl recess 14. A surface 9 between burl structures 6 may be substantially planar and face towards a substrate W supported by the substrate support 2 in use. When the radially outer surface 8 is tapered the radially outer surface 8 may meet the surface 9 at an oblique angle (rather than at 90 degrees).

The substrate table WT is configured to provide an outward flow of fluid (e.g. liquid and/or gas) through the burl structures 6. The outward flow of fluid passes out of the burl recesses 14 towards a substrate W to be supported by the substrate table WT (upwards in the orientation of FIGS. 2 and 3). The outward flow of fluid may be provided for example during loading and/or unloading of a substrate W onto the substrate table WT and/or, at least briefly, while the substrate W is fully loaded on the substrate table WT, to reduce frictional forces between the burl structures 6 and the substrate W. The outward flow of fluid may be provided using a fluid source 4 (e.g. a gas source or a liquid source), together with any suitable combination of apparatus for controllably directing a fluid flow, including for example any combination of ducting, valves, pumps, filters, sensors and/or other suitable components.

The substrate support 2 comprises a base member 20. The base member 20 may comprise a portion of a silicon wafer, for example. The base member 20 comprises a plurality of holes 12 extending through the base member 20. In the example of FIG. 3, the holes 12 extend vertically through the base member 20. Each hole 12 is substantially cylindrical in the example shown with a vertical axis of cylindrical symmetry. In some embodiments the holes 12 may have other orientations and/or shapes, such as shapes with non-circular cross-sections or with cross-sections that vary in size as a function of depth. One or more of the holes 12 may, for example, be tapered. An opening of each hole 12 in the top surface of the base member 20 faces upwards. An opening of each hole 12 in the bottom surface of the base member 20 faces downwards. Each hole 12 may be referred to as a channel. In an embodiment, each hole 12 is elongated (e.g. the length of each hole 12 is larger than the diameter of the hole 12). In an embodiment, each hole 12 has a diameter in the range of 0.001 to 0.2 mm, optionally in the range of 0.001 to about 0.05 mm. In an embodiment, each hole 12 has a length in the range of 0.005 to 1 mm, optionally in the range of 0.005 to about 0.2 mm.

Each burl structure 6 comprises an opening to at least one of the holes 12. In embodiments where the burl structures 6 do not have recessed surfaces 13, the opening or openings may be provided in the distal surfaces 11 contacting the substrate W. In embodiments such as those shown in FIGS. 3-22 where the burl structures 6 comprise recessed surfaces 13, each recessed surface 13 may comprise the opening to at least one of the holes 12. Each recessed surface 13 partially blocks the flow of fluid relative to if the recessed surface 13 were absent. The combination of recessed surface 13 and holes 12 in each burl structure 6 therefore acts as a flow restrictor. The amount of flow restriction depends on the cross-sectional area and number of the holes 12.

In some embodiments, burl structures 6 are provided that each comprise openings to at least two of the holes 12 in the base member 20. Where the burl structures 6 comprise recessed surfaces 13, each recessed surface 13 may comprise the openings to at least two of the holes 12 in the base member 20. Providing multiple holes 12 in each of the burl structures 6 and/or recessed surfaces 13 improves robustness of the flow restricting functionality. Contamination is less likely to interfere with multiple holes than with a single hole. In an embodiment, the substrate table WT is configured to provide an outward flow of fluid through all of the openings in each of one or more of the burl structures 6 and/or recessed surfaces 13.

In some embodiments, as exemplified in FIG. 3, the base member 20 further comprises a plurality of base recesses 15 in the base member 20. FIG. 3 depicts one such base recess 15 on the underside of the base member 20. Each base recess 15 is aligned with a different respective one of the burl structures 6 on an opposite side of the base member 20 (e.g. such that each base recess 15 is aligned with a different burl structure 6). The alignment is such that the outward flow of fluid is provided by driving a flow of fluid (e.g. from fluid source 4) through the base recess 15 and the burl recess 14 of the respective burl structure 6 via the holes 12 in the base member 20. When the substrate support 2 is attached to the substrate table WT (e.g. as shown in FIG. 2), the base recess 15 can form a channel leading from the burl structure 6 to further ducting in the substrate table WT.

In some embodiments, for each of one or more of the burl structures 6, when viewed perpendicularly to a plane of the base member 20, a cross-sectional area of each hole 12 opening into the recessed surface 13 in the burl recess 14 is smaller than a cross-sectional area of the respective base recess 15 aligned with the burl structure 6 and smaller than a cross-sectional area of the burl recess 14. The holes 12 thus act to restrict flow through each burl structure 6 relative to the notional case where each burl structure 6 comprised a base recess 15 connected directly to a burl recess 14 with no restricting structure provided in between (i.e. no recessed surface 13 with holes 12).

FIGS. 4-7 depict embodiments in which each of one or more of the burl structures 6 comprises one or more sub-burls 32 within the burl recess 14 of the burl structure 6. Each sub-burl 32 has a distal tip 11B. The distal tip 11B forms a portion of the distal surface of the burl structure 6 that contacts, in use, the substrate W supported by the substrate support 2. The portion of the distal surface provided by the distal tip 11B is less than all of the distal surface of the burl structure 6. In embodiments of this type, each of one or more of the burl structures 6 may comprise a wall surrounding the burl recess 14 in directions parallel to a plane of a supported substrate W in use (e.g. in all horizontal directions in the orientation shown in the figures). A distal portion 11A of the wall forms a portion of the distal surface that contacts the supported substrate W in use. The distal tip 11B of each of the sub-burls 32 is spaced apart from the distal portion 11A of the wall in all directions parallel to the plane of the supported substrate W in use. In the example shown, a single sub-burl 32 is provided in the center of the burl recess 14 when viewed from above. In other embodiments, the sub-burl 32 may be provided at other locations. In other embodiments, multiple sub-burls 32 may be provided in each of one or more of the burl structures 6, each having distal tips 11B that are spaced apart from the distal portion 11A of the respective wall in all directions parallel to the plane of the supported substrate W in use.

The provision of sub-burls 32 as described above can improve mechanical robustness of the burl structure 6. Increasing the robustness of the burl structure 6 may increase freedom for tuning other properties of the burl structure 6, such as the width of the distal portion 11A of the wall, without compromising overall robustness. The provision of sub-burls 32 also provides an opportunity to have different topographies or roughness in different parts of individual burls (e.g. between the distal portion 11A of a wall and the distal tip 11B of a sub-burl 32 within the wall). The approach also provides an opportunity to provide different top coatings in different parts of individual burl structures 6. For example, to improve robustness of the burl structure 6 during landing or lift-off of a substrate W, where there may be mechanical sliding contact, the distal tip 11B may be configured to have a surface that has a relatively low surface energy (e.g. lower than the surface energy of the distal portion 11A of the wall), is relatively rough (e.g. rougher than the distal portion 11A of the wall) and/or provides relatively low friction (e.g. lower friction than the distal portion 11A of the wall).

Figure 4:
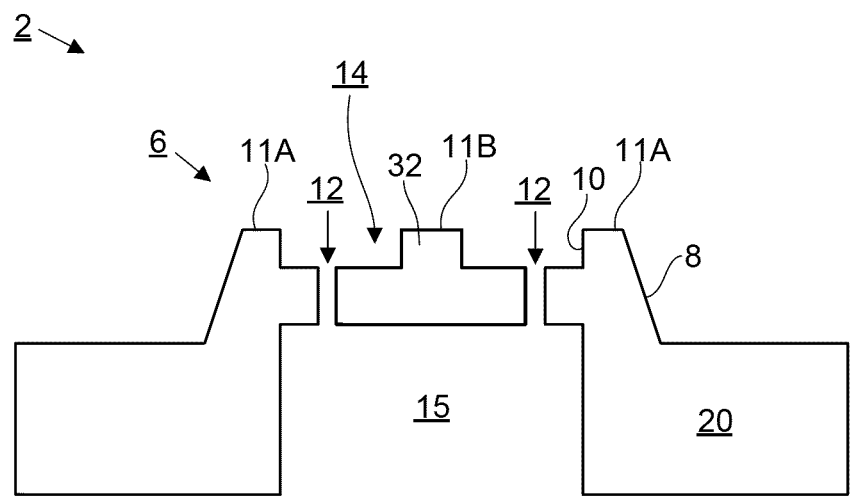
FIG. 4 is a schematic side sectional view of a portion of a substrate support comprising a burl structure with a sub-burl.
Figure 5:
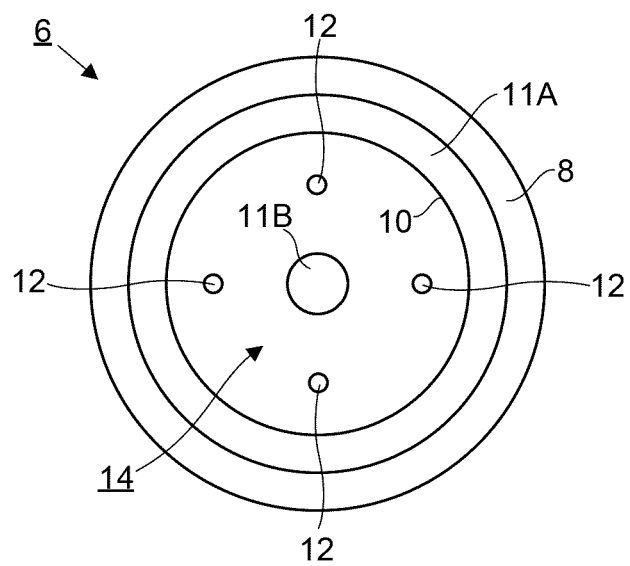
FIG. 5 is a schematic top view of the burl structure of FIG. 4.
Figure 6:
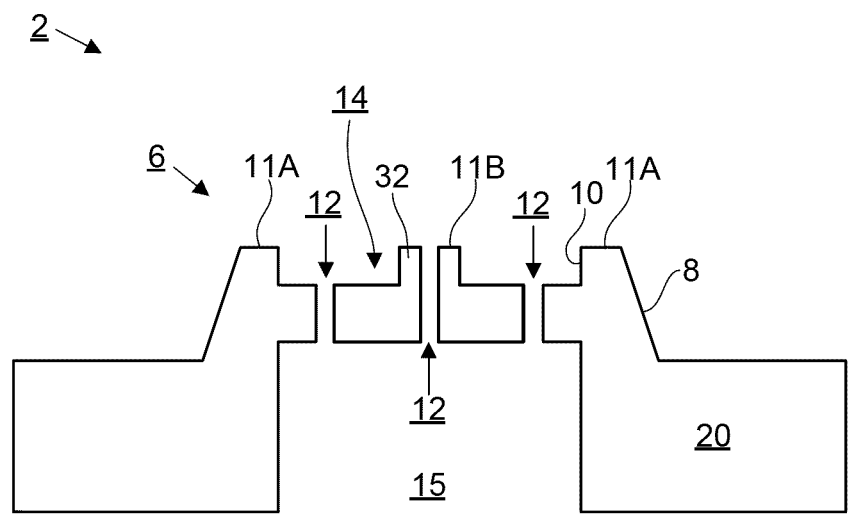
FIG. 6 is a schematic side sectional view of a portion of a substrate support comprising a burl structure with a sub-burl having a hole passing through the sub-burl.
Figure 7:
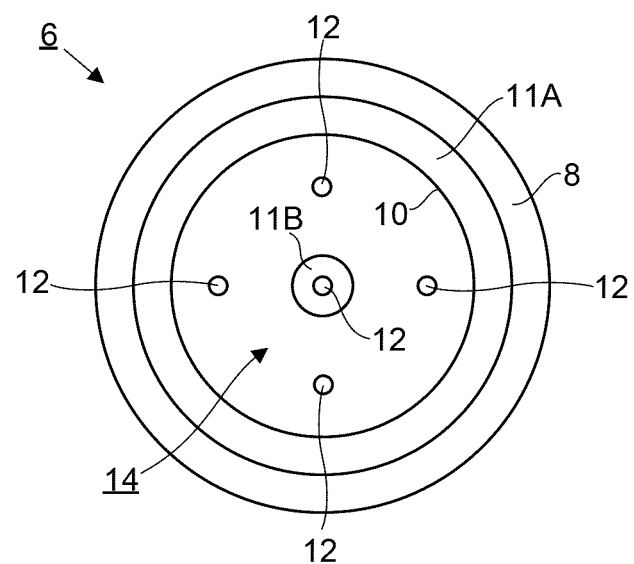
FIG. 7 is a schematic top view of the burl structure of FIG. 6.

In embodiments of the type depicted in FIGS. 4 and 5, all of the holes 12 passing through a portion of the base member 20 corresponding to each burl structure 6 have openings in the recessed surface 13 of the burl structure 6. None of the holes 12 pass through any of the sub-burls 32. In other embodiments, as exemplified in FIGS. 6 and 7, at least one of the holes 12 formed through the base member 20 passes through at least one of the sub-burls 32. In the example shown, a single sub-burl 32 is provided in the burl structure 6 shown and one of the holes 12 passes through the sub-burl 32 of that burl structure 6 along an axis of cylindrical symmetry of the sub-burl 32. Arranging for a hole 12 to pass through the sub-burl 32 allows frictional forces to be lowered between the sub-burl 32 and the substrate W being supported. The holes 12 passing through the sub-burls 32 may also allow surfaces in the vicinity of openings of the holes 12 in the sub-burls 32 to be periodically cleaned and/or reconditioned (e.g. by driving a fluid through the sub-burls 32).

Figure 8:
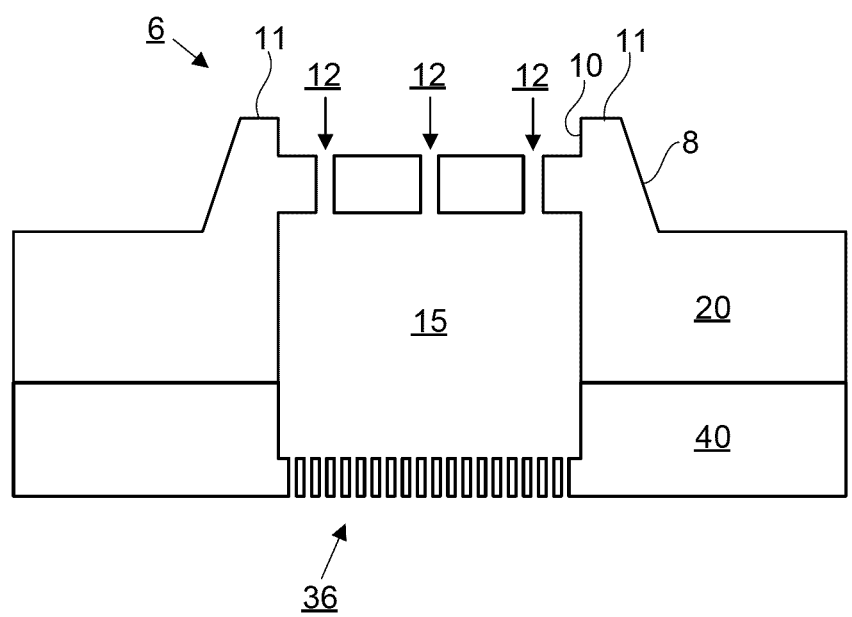
FIG. 8 is a schematic side sectional view of a portion of a substrate support having a porous layer upstream of a burl structure.

In some embodiments, it may be desirable to provide filtering functionality upstream of one or more of the burl structures 6. The filtering may be configured, for example, to prevent contaminant particles that are larger than a predefined size from reaching the burl structures 6 and/or any region downstream of the burl structures 6 (e.g. between the substrate support 2 and the substrate W). In some embodiments, a porous layer 36 is provided upstream of the openings in each of at least one of the burl structures 6, for example upstream of holes 12 passing through the recessed surface 13 of at least one of the burl structures 6. The porous layer 36 may be formed in the base member 20 or, as depicted in FIG. 8, in a separate member 40 attached to the base member 20. In some embodiments, the holes 12 and the burl structures 6 are formed in the base member 20. Alternatively, the substrate support 2 may further comprise a burl formation member 30 joined to the base member 20. The burl formation member 30 may comprise a portion of a silicon wafer for example. In embodiments having a burl formation member 30, examples of which are described further below with reference to FIGS. 9-16, the burl structures 6 may be formed exclusively in the burl formation member 30. As described below with reference to FIGS. 9-16, forming the holes 12 and burl structures 6 in different members provides manufacturing advantages.

In an embodiment, as exemplified in FIG. 8, the porous layer 36 comprises a plurality of holes formed in a solid member such as a portion of a silicon wafer (the separate member 40 in the example shown). In an embodiment, the size of each of the holes of the porous layer 36, and/or an average size of the holes in the porous layer 36, is smaller than each of the holes 12 formed in the base member 20. In an embodiment, the number of holes per unit area in the porous layer 36 is larger than the number of holes 12 per unit area in the recessed surface 13 of each burl structure 6. The holes in the porous layer 36 may be formed using any known technique for forming holes of a suitable size, including for example deep reactive ion etching or focused ion-beam milling. The holes in the porous layer 36 may therefore be substantially cylindrical, with axes of cylindrical symmetry aligned with axes of cylindrical symmetry of one or more of the holes 12 through the recessed surfaces 13 of the burl structures 6.

FIGS. 9-16 depict steps in an example method for manufacturing a substrate support 2 for a lithographic apparatus LA. The substrate support 2 may take any of the compatible forms described above with reference to FIGS. 2-8.

In an embodiment, in an initial step of the method, a base member 20 is provided. A hard mask layer 16 is optionally provided on the base member 20 to provide the arrangement of FIG. 9.

Figure 9:
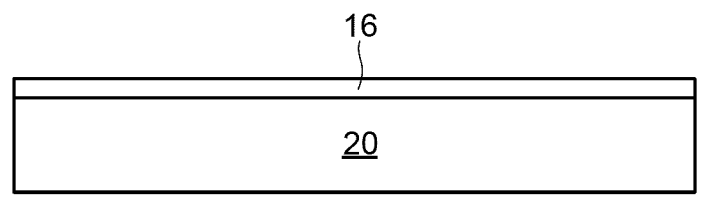
FIGS. 9-16 schematically depict steps in a method of manufacturing a substrate support comprising the step of joining a base member to a burl formation member.
Figure 10:
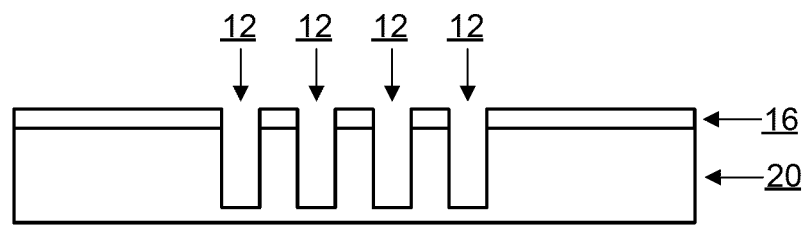

In an embodiment, in a subsequent step, the arrangement of FIG. 9 is processed to form a pattern in the hard mask layer 16. A removal process, for example deep reactive ion etching or focused ion-beam milling, is then applied to form holes 12 in the base member 20, thereby forming the arrangement of FIG. 10. The holes 12 are formed in a pattern defined by the patterned hard mask layer 16. At this stage, the holes 12 may be blind (as depicted) or may penetrate through the base member 20.

Figure 11:
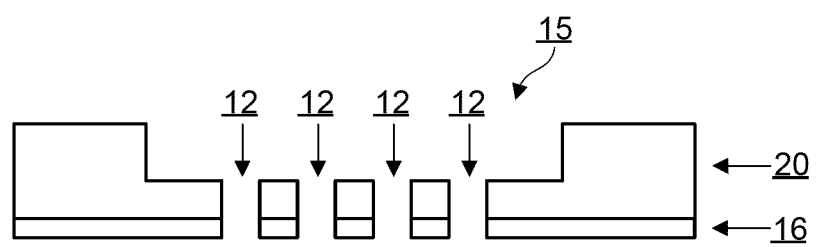

In an embodiment, in a subsequent step, the base member 20 is turned over and a plurality of base recesses 15 are formed in the base member 20, thereby forming the arrangement shown in FIG. 11. FIG. 11 depicts one of the base recesses 15. The shape and depth of each base recess 15 is not particularly limited. In some embodiments, each base recess 15 is substantially cylindrical, with an axis of cylindrical symmetry perpendicular to a plane of the base member 20. In the embodiment shown, each base recess 15 is deep enough to ensure that the holes 12 now penetrate through the base member 20.

Figure 12:
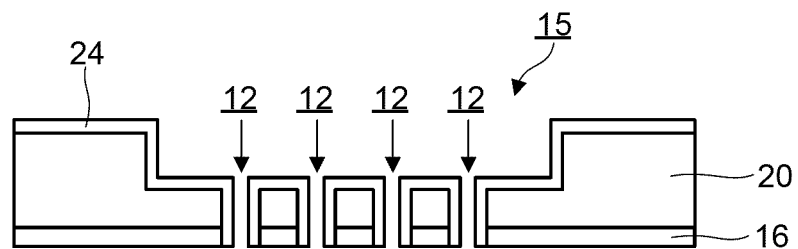

In an embodiment, in a subsequent step, as depicted in FIG. 12, a coating 24 is applied. The coating 24 covers interior surfaces of the base recesses 15. The coating 24 also covers an interior surface of each of the holes 12. The coating 24 is applied from a side of the base member 20 opposite to where the burl structures 6 are to be located (formation of the burl structures 6 is described below). The coating 24 may be configured to reduce the risk of contamination clogging any of the holes 12 in use. In some embodiments, the coating 24 is hydrophobic and/or has anti-static properties. Providing the coating 24 before the burl structures 6 are present avoids possible contamination of the burl structures 6 by the material of the coating 24.

Figure 13:
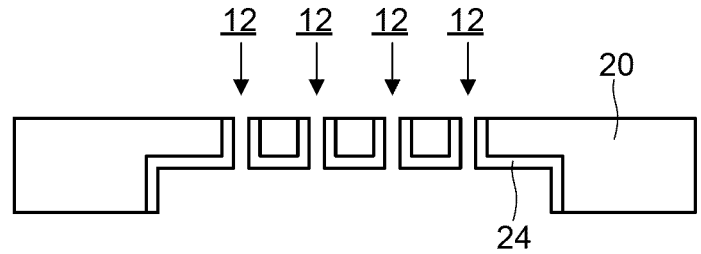

In an embodiment, in a subsequent step, as depicted in FIG. 13, upper and lower surfaces of the arrangement of FIG. 12 are processed to remove the hard mask layer 16 and the coating 24 in regions outside of the base recesses 15.

Figure 14:
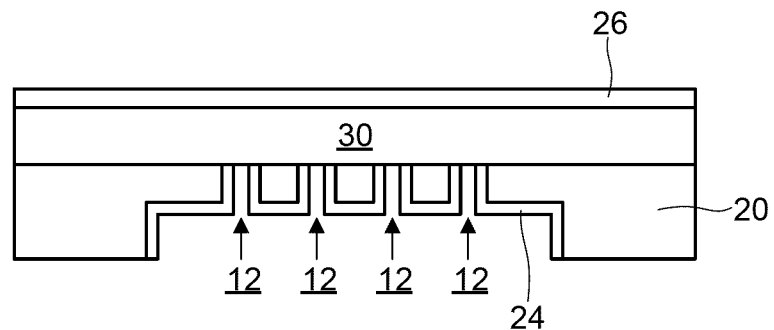

In an embodiment, in a subsequent step, as depicted in FIG. 14, a burl formation member 30 is joined to the base member 20. In this embodiment, the burl formation member 30 is joined to the base member 20 after the holes 12 have been formed in the base member 20. The process of forming the holes 12 cannot therefore contribute contamination to the burl formation layer 30. Any coating 24 that has been provided to the base member 20 will also be provided before the burl formation member 30 is joined to the base member 20, thereby also avoiding cross-contamination with material of the coating 24.

The burl formation member 30 may be formed by thinning down a silicon wafer to a desired thickness. In an embodiment, the burl formation member 30 is joined to the base member 20 via one or more additional layers (not shown), thereby providing a multi-layer structure having three or more layers. The one or more additional layers may provide additional desired functionality. For example, the one or more additional layers may comprise an electrically insulating layer to electrically isolate an upper portion of the substrate support 2 from the rest of the substrate support 2 and/or elements connected to the substrate support 2 from below. In some embodiments, the burl structures 6 can be electrically grounded via the burl formation member 30.

Alternatively or additionally, each of either or both of the burl formation member 30 and the base member 20 may be formed from multiple layers.

In some embodiments, as depicted in FIG. 14, a burl coating 26 is provided on the burl formation member 30. The burl coating 26 is configured to be suitable for contacting the substrate W in use. The burl coating 26 may be configured, for example, to provide a lower friction contact than would be the case in the absence of the burl coating 26. The burl coating 26 is provided on the burl formation member 30 before joining of the base member 20 to the burl formation member 30. A risk of clogging of any of the holes 12 in the base member 20 by material of the burl coating 26 is thereby reduced or avoided.

In some embodiments, a plurality of burl structures 6 are formed in the burl formation member 30. Forming the burl structures 6 in a separate burl formation member 30 rather than the base member 20 facilitates accurate control of the height of the burl structures 6. A height of the burl structures 6 can be defined by the thickness of the burl formation member 30, which can be controlled with high accuracy. Forming the holes 12 in the base member 20 without the burl formation member 30 being present also prevents cross-contamination between processes used to form the holes 12 (e.g. deep reactive ion etching or focused ion-beam milling) and processes used to form the burl structures 6.

Figure 16:
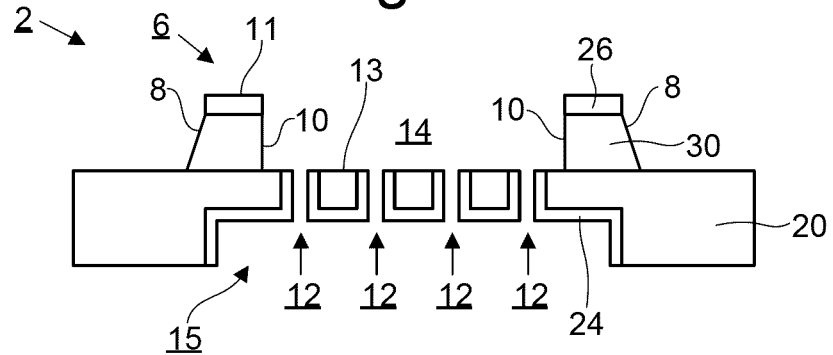

In an embodiment, the burl structures 6 are formed after the burl formation member 30 has been joined to the base member 20. The combination of the burl structures 6 and the base member 20 provide a substrate support 2. An example of such a substrate support 2 is shown in FIG. 16. The burl structures 6 are formed in such a way that each burl structure 6 comprises a distal surface 11 that contacts, in use, a substrate W being supported by the substrate support 2. In the example shown, the distal surface 11 is a surface of the burl coating 26. In other embodiments, the distal surface 11 may be a surface of the burl formation member 30 (e.g. where no burl coating 26 is provided). Each burl structure 6 comprises an opening to at least one of the holes 12 formed through the base member 20. In some embodiments, as depicted, each burl structure 6 comprises a burl recess 14. The burl recess 14 extends from the distal surface 11 to a recessed surface 13 in the burl structure 6. In embodiments of this type, the recessed surface 13 comprises the opening to at least one of the holes 12 formed through the base member 20.

Figure 15:
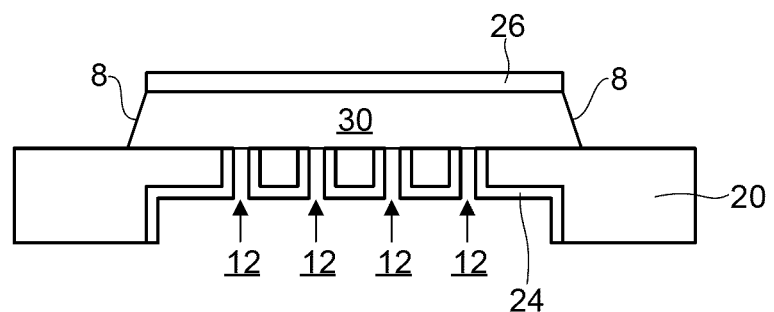

In an embodiment, the substrate support 2 of FIG. 16 is formed starting from the arrangement of FIG. 14 by first removing material from outside of the burl structures 6 to provide the arrangement of FIG. 15. The material may be removed, for example, using laser ablation or etching. In a subsequent step, material is removed from inside the burl structures 6 to form the recessed surfaces 13 and thereby provide the substrate support 2 of FIG. 16. The material may be removed, for example, using laser ablation or etching. In embodiments of this type, the burl structures 6 are thus formed by removing material from outside of the burl structures 6 before removing material from inside of the burl structures 6. This approach is advantageous because it is not necessary to protect the inside of the burl structures 6 when removing the material from outside of the burl structures 6 (which may be performed using laser ablation, for example, which can generate a significant amount of debris). In other embodiments, material may be removed simultaneously from inside and outside of the burl structures 6 to form the arrangement of FIG. 16 directly from the arrangement of FIG. 15 (i.e. without the intermediate step leading to the arrangement of FIG. 15). In still other embodiments, the burl structures 6 are formed by removing material from inside of the burl structures 6 before removing material from outside of the burl structures 6.

In some embodiments, the removal of the material inside the burl structures 6 comprises removing material down to at least an upper surface of the base member 20 underneath the burl formation member 30. In embodiments of this type, the recessed surfaces 13 each comprise a surface of the base member 20 (as depicted in FIG. 16).

In the example method described above with reference to FIGS. 9-16, a substrate support 2 is manufactured by joining a base member 20 to a burl formation member 30. The holes 12 are formed in the base member 20 while the burl structures 6 are formed in the burl formation member 30. FIGS. 17-22 depict an alternative approach in which both the holes 12 and the burl structures 6 are formed in the base member 20.

Figure 17:
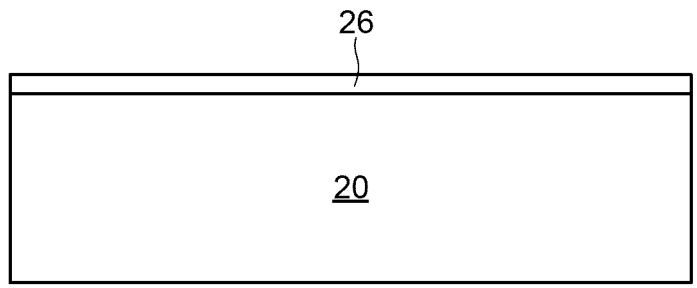
FIGS. 17-22 schematically depict steps in a method of manufacturing a substrate support in which holes and burl structures are formed in the same base member.

In an initial step, as depicted in FIG. 17, a base member 20 is provided. In the example shown, a burl coating 26 is provided on the base member 20. The burl coating 26 may be configured in any of the ways described above for the burl coating 26 in FIGS. 14-16.

Figure 18:
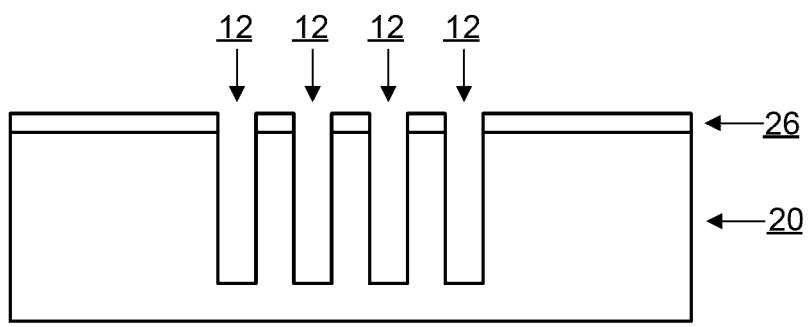

In an embodiment, in a subsequent step, a removal process is used to form holes 12 through the base member 20 and the burl coating 26 to provide the arrangement shown in FIG. 18. The removal process may comprise deep reactive ion etching or focused ion-beam milling for example. At this stage, the holes 12 may be blind (as depicted) or may penetrate through the base member 20.

Figure 19:
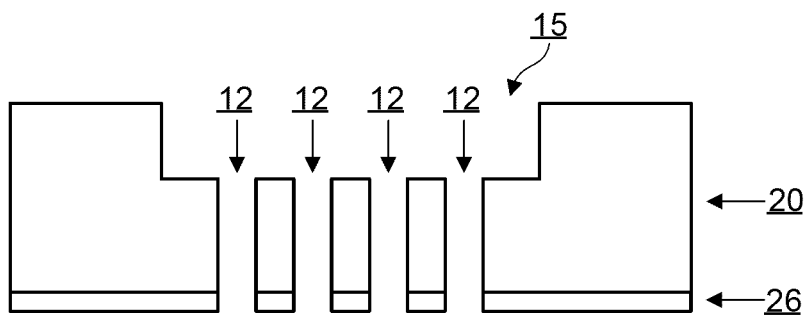

In an embodiment, in a subsequent step, the arrangement of FIG. 18 is turned over and a removal process is applied to form a plurality of base recesses 15, thereby providing the arrangement of FIG. 19. The base recesses 15 are thus formed before the burl structures 6 (which are formed as described below) in this embodiment. Forming the base recesses 15 before the burl structures 6 is desirable because it avoids having to support the structure on delicate burl structures 6 during formation of the base recesses 15. The manufacturing process is thus made simpler and/or risk of damage to burl structures 6 is reduced or avoided. The shape and depth of each base recess 15 is not particularly limited. In some embodiments, each base recess 15 is substantially cylindrical, with an axis of cylindrical symmetry perpendicular to a plane of the base member 20. In the embodiment shown, each base recess 15 is deep enough to ensure that the holes 12 now penetrate through the base member 20.

Figure 20:
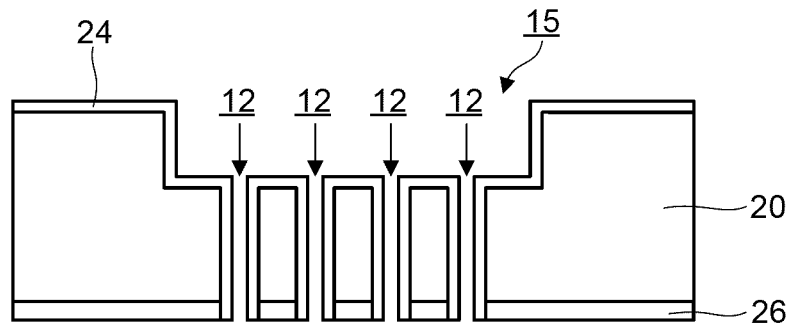

In an embodiment, in a subsequent step, as depicted in FIG. 20, a coating 24 is applied. The coating 24 covers the interior surface of the base recesses 15. The coating 24 also covers an interior surface of each of the holes 12. In some embodiments, the coating 24 is hydrophobic and/or has anti-static properties.

Figure 21:
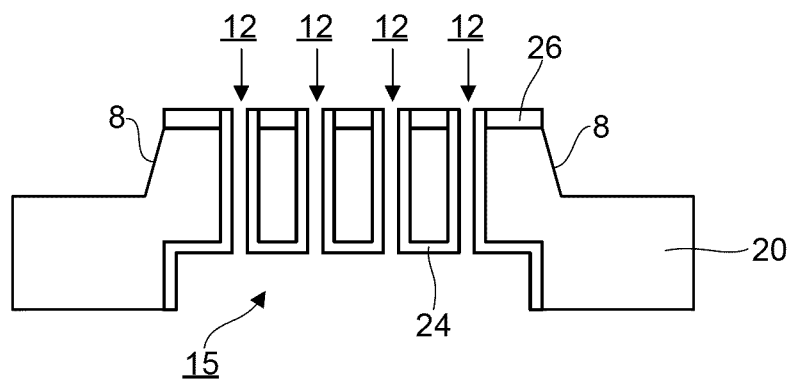
Figure 22:
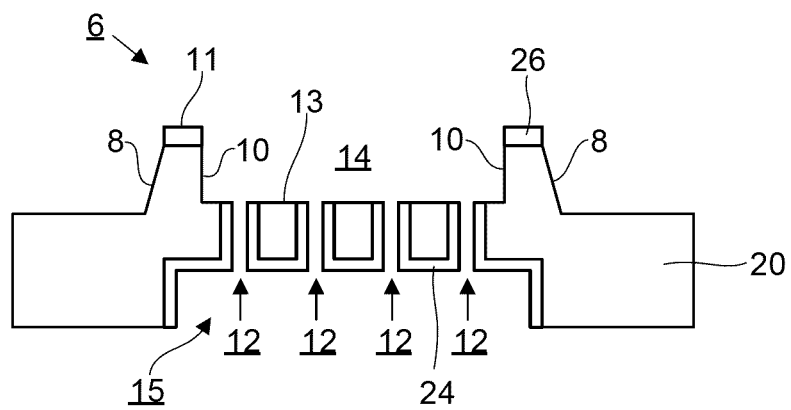

In an embodiment, a substrate support 2, as depicted in FIG. 22, is formed starting from the arrangement of FIG. 20 by first removing material from outside of the burl structures 6 to provide the arrangement of FIG. 21. In a subsequent step, material is removed from inside the burl structures 6 to form the recessed surfaces 13 and thereby provide the substrate support 2 of FIG. 22. In embodiments of this type, the burl structures 6 are thus formed by removing material from outside of the burl structures 6 before removing material from inside of the burl structures 6. Advantages associated with this approach have been discussed above. In other embodiments, material may be removed simultaneously from inside and outside of the burl structures 6 to form the arrangement of FIG. 22 directly from the arrangement of FIG. 20 (i.e. without the intermediate step leading to the arrangement of FIG. 21). In still other embodiments, the burl structures 6 are formed by removing material from inside of the burl structures 6 before removing material from outside of the burl structures 6.

In embodiments of the type described above, at least a portion of each hole 12 through the base member 20 is formed (e.g. to form at least the blind holes as shown in FIG. 18), optionally all of each hole 12 is formed, before the burl structures 6. Forming all or at least a portion of the holes 12 at an early stage facilitates manufacture by reducing the extent to which pre-existing structures need to be protected, or taken account of, during the removal process (e.g. deep reactive ion etching or focused ion-beam milling), for example by requiring special arrangements to hold the base member 20 during the removal process and/or to otherwise protect the pre-existing structures from mechanical damage and/or contamination.

In other embodiments, variations on the sequence described above with reference to FIGS. 17-22 may be made. For example, in some embodiments the formation of the plurality of base recesses 15, as depicted in FIG. 19, is performed after one or more of the steps described with reference to FIGS. 20-22 (e.g. after the removal of material from outside and inside of the burl structures 6). Alternatively or additionally, the order of the material removal processes used to form the burl structures 6, as described with reference to FIGS. 21 and 22, may be reversed. In such embodiments, material is thus removed from inside of the burl structures 6 to form the recessed surfaces 13 before material is removed from outside of the burl structures 6 (with the base recesses 15 being formed before or after). Alternatively or additionally, in some embodiments the holes 12 are formed through the base member 20 after one or more of the steps described above with reference to FIGS. 19-22 (e.g. after the formation of the plurality of base recesses 15, after the removal of material from outside of the burl structures 6, and/or after removal of material from inside of the burl structures 6 to form the recessed surfaces 13). For example, in one embodiment the removal of material from inside of the burl structures 6 to form the recessed surfaces 13 is performed before the holes 12 are formed through the base member 20 and the removal of material from outside of the burl structures 6 is performed after the holes 12 are formed through the base member 20. In a first variation of this example, the base recesses 15 are formed after the holes 12 are formed through the base member 20 and before the removal of material from outside of the burl structures 6. In a second variation of this example, the base recesses 15 are formed after the removal of material from outside of the burl structures 6.

Figure 23:
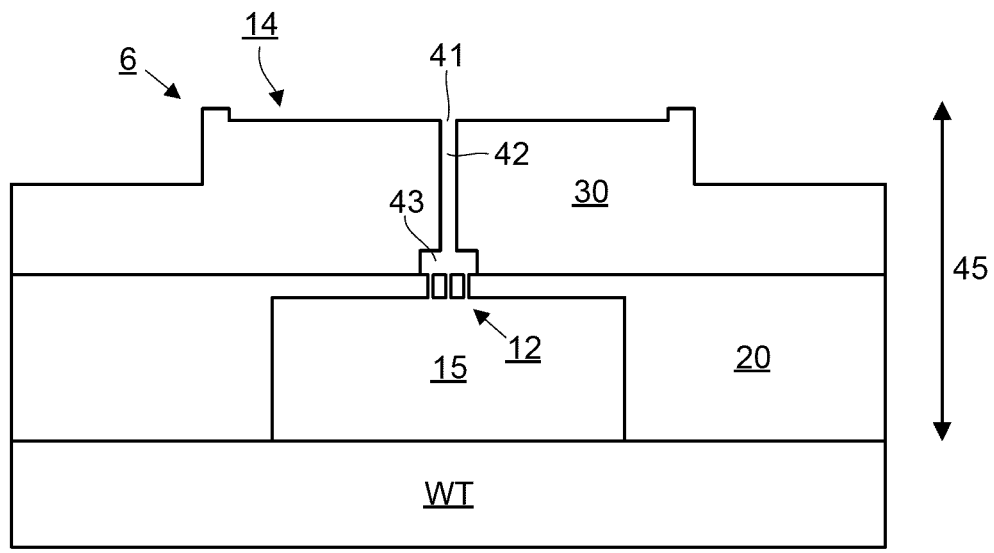
FIG. 23 is a schematic side sectional view of a portion of a further example substrate support comprising a burl structure.

FIG. 23 depicts a portion of a further example substrate support 2 mounted on a substrate table WT. In this example, the substrate support 2 comprises a base member 20 and a burl formation member 30 joined to the base member 20. The burl formation member 30 comprises a plurality of burl structures 6. The base member 20 comprises a plurality of holes 12 extending through the base member 20. The burl structures 6 and holes 12 may take any of the forms described in relation to the substrate supports 2 discussed above.

Each burl structure 6 comprises an opening 41 to at least one of the holes 12 in the base member 20. In the example shown, an elongate intermediate passage 42 and intermediate chamber 43 are provided in the flow path between the opening 41 and the holes 12 in the base member 20. The opening 41 is thus fluidically connected to the holes 12 by the intermediate passage 42 and intermediate chamber 43. As mentioned below, the intermediate chamber 43 may be omitted, for example where the elongate intermediate passage 42 is sufficiently tapered. In the examples of FIGS. 3-22 the opening is connected directly to each of the holes 12 in the base member 20.

A flow resistance in respect of flow through the holes 12 in the base member 20 is larger than a flow resistance in respect of flow through the intermediate passage 42 and intermediate chamber 43. The portion of the base member 20 providing the holes 12 therefore acts as a flow restrictor. The amount of flow restriction depends on the cross-sectional area and number of the holes 12. Relative dimensions of the elements depicted in FIG. 23 can vary depending on details of the implementation context. In one class of implementation, a diameter of the intermediate passage 42 may be of the order of 10-100 times larger than a diameter of each hole 12 in the base member 20. An overall height (labelled 45) of the combination of base member 20 and burl formation member 30 may be of the order of 0.5 to 1.5 mm for example.

Figure 24:
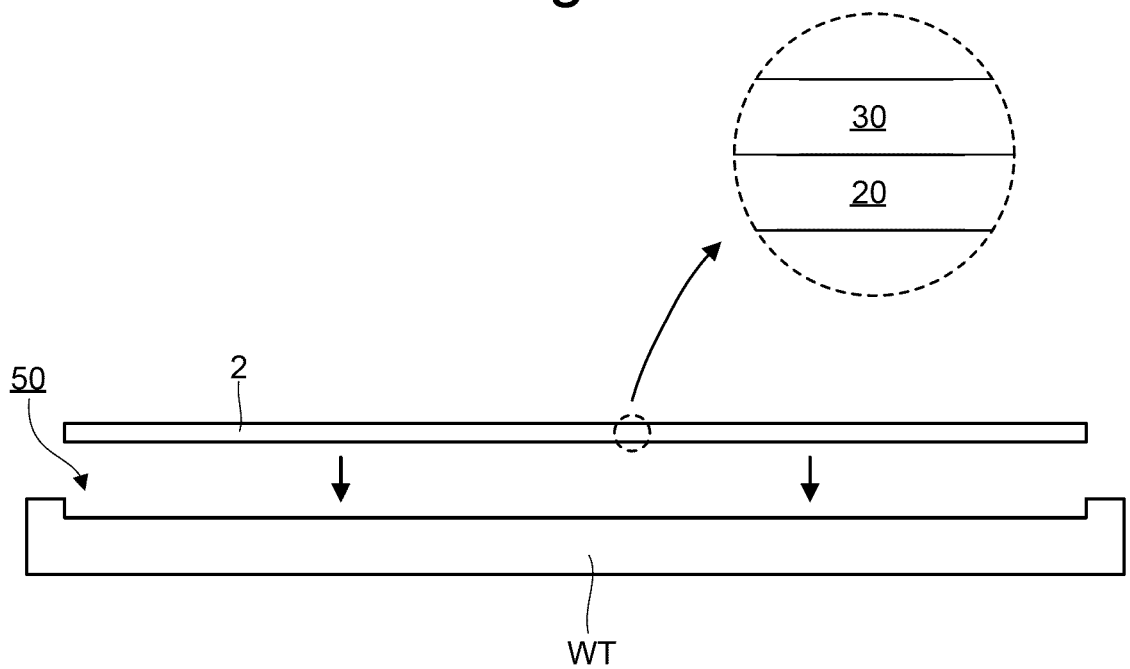
FIG. 24 is a schematic side sectional view showing how a substrate support can be mounted in a recess formed in a portion of a substrate table, with an inset showing a magnified portion of a layered structure of the substrate support.

In some embodiments, the substrate support 2 may be fitted to the underlying substrate table WT in a recess 50 (e.g. have a depth of about 0.5 mm to 1 mm) formed in the substrate table WT, as depicted in FIG. 24. The substrate support 2 may therefore be easily retrofitted to existing substrate tables WT without changing an overall height of the substrate table WT.

Figure 25:
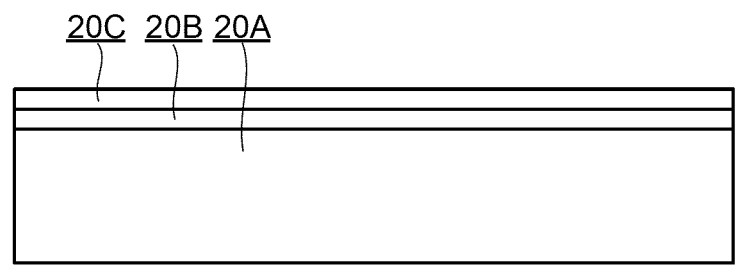
FIGS. 25-27 schematically depict steps in a method of manufacturing a base member of a substrate support.
Figure 26:
Figure 27:
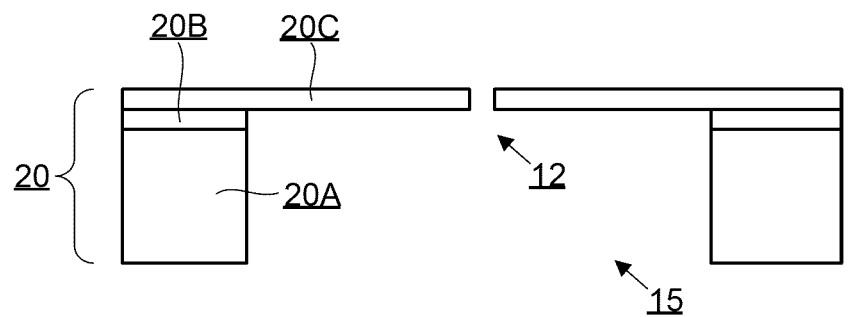

FIGS. 25-27 depict stages in an example process for manufacturing a base member 20 of the type described above with reference to FIGS. 23 and 24. The process is applicable both to the case where a plurality of the holes 12 are provided per burl structure 6 and the case where a single hole 12 is provided per burl structure 6. The process may use a silicon-on-insulator (SOI) substrate to achieve an accurate layer thickness for providing the flow-restricting holes 12, to accommodate wafer fab manufacturing processes, and/or to provide a good thermal expansion coefficient match to substrate tables WT formed from SiSiC.

In a first step, as depicted in FIG. 25, an SOI substrate is provided (e.g. of 300 mm diameter). Layer 20A is the handle Si substrate layer of the SOI substrate. Layer 20B is the buried $SiO_2$ layer of the SOI substrate. Layer 20C is the device layer of the SOI substrate, formed from Si.

In a second step, as depicted in FIG. 26, a base recess 15 is formed in the base member 20. The base recess 15 may take any of the forms described above with reference to FIGS. 3-24. The base recess 15 may be formed by selective etching. Alternatively or additionally, the base recess 15 may be formed using laser processing. Laser processing may be less intrinsically clean than selective etching and care may be needed to maintain the thickness of the layer in which the holes 12 are formed. A difference in threshold fluence between Si and $SiO_2$ may not be sufficient to use the $SiO_2$ as an intrinsic processing stop (e.g. by arranging for a laser processing fluence to be higher than a threshold fluence for Si but lower than a threshold fluence for $SiO_2$, such that the laser processing automatically stops when it reaches the $SiO_2$) as it may be used in selective etching. The $SiO_2$ may, however, be used as a visual processing stop (e.g. by arranging for the processing to be stopped when the $SiO_2$ becomes visible).

In a third step, as depicted in FIG. 27, the holes 12 are formed. In the example shown, only a single hole 12 is formed but the approach may be used to form multiple holes 12. The one or more holes 12 may be formed using Deep Reactive-Ion Etching (DRIE) or laser micro-drilling. The most uniform and clean results may be obtained using DRIE, but this approach is relatively complex and costly. Laser micro-drilling provides a less costly alternative.

FIGS. 28-31 depict stages in an example process for manufacturing a burl formation member 30. The process may use a SiC substrate to provide suitable mechanical robustness and match the thermal expansion coefficients of substrate tables WT formed from SiSiC and the base member 20 (formed from an SOI substrate for example). The process shown relies on laser processing, which is compatible with techniques used for manufacturing other aspects of substrate tables WT.

Figure 28:
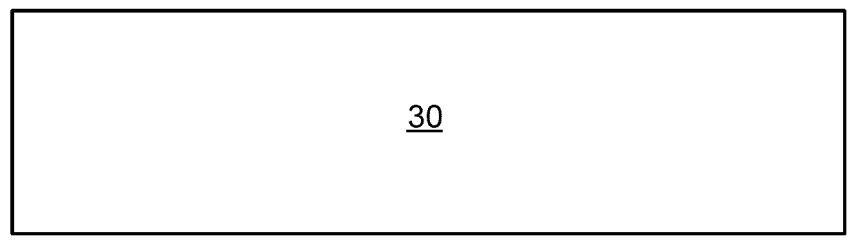
FIGS. 28-31 schematically depict steps in a method of manufacturing a burl formation member of a substrate support.

In a first step, as depicted in FIG. 28, a SiC substrate is provided (e.g. of 300 mm diameter).

Figure 29:
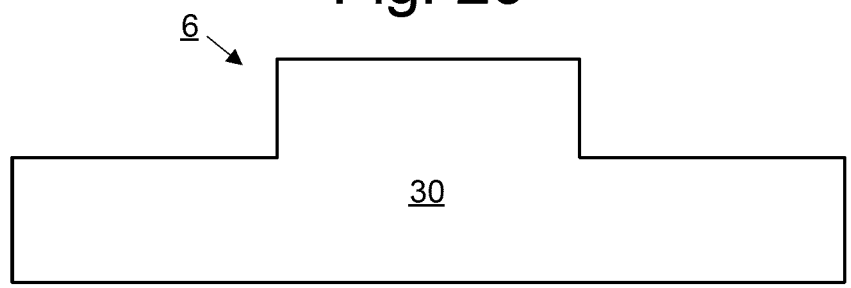

In a second step, as depicted in FIG. 29, laser structuring is used to remove material outside of burl structures 6.

Figure 30:
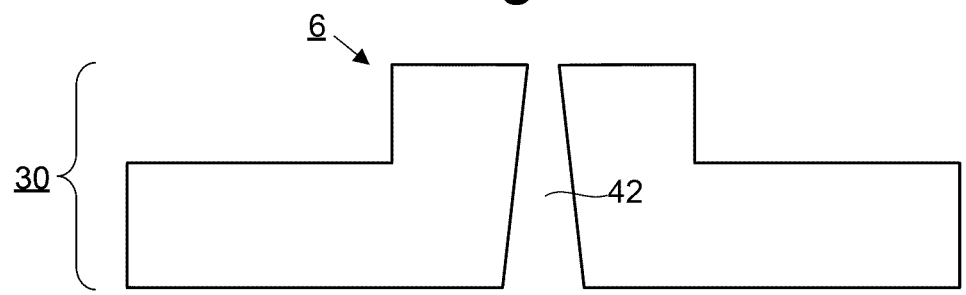

In a third step, as depicted in FIG. 30, laser drilling is used to form the elongate intermediate passage 42. The laser drilling is performed from the bottom side, which provides advantageous tapering. The tapering makes it easier to achieve adequate alignment between the intermediate passage 42 and corresponding structures in the base member 20 such as the holes 12. The tapering may mean, for example, that the intermediate chamber 43 is not required.

Figure 31:
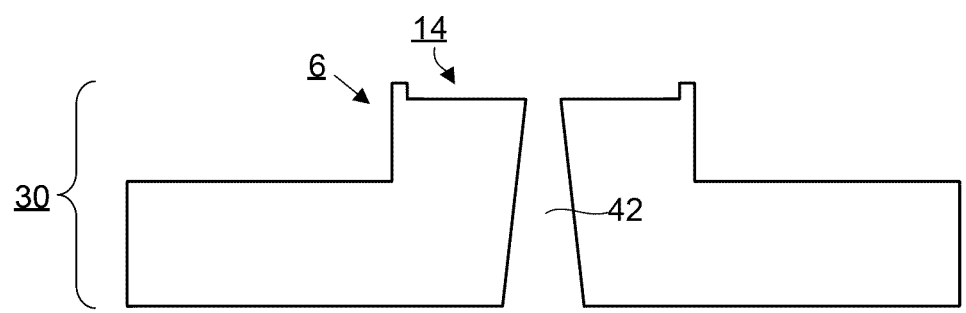

In a fourth step, as depicted in FIG. 31, laser ablation is used to form the burl recess 14. A surface roughening process may also be applied to prevent optical bonding between the substrate support 2 and a substrate W in use. Various techniques may be used to achieve the surface roughening, including for example one or more of the following: ion beam figuring (IBF), laser processing, mechanical abrasive roughening, chemical abrasive roughening, performing coating with inherent roughness, and starting with only a single-side-polished SiC substrate.

Other processing techniques may be used to form the burl formation member 30. These may include one or more of the following: electrodischarge machining (EDM), milling, grinding, and etching. Etching may be used, for example, instead of laser drilling to form the intermediate passages 42 in the third step. The burl recess 14 may be formed by EDM or etching instead of laser ablation in the fourth step.

In an embodiment, the burl formation member 30 is attached to the base member 20 after the base member 20 has been processed to provide the holes 12 (e.g. as depicted in FIG. 27). One or more of the processing steps performed on the burl formation member 30 to provide the arrangement shown in FIG. 31, such as forming a plurality of burl structures 6, may be performed before or after the burl formation member 30 has been attached to the base member 20.

Embodiments are provided according to the following clauses:

1. A substrate table configured to support a substrate during a lithography process, comprising:
   a substrate support comprising: a plurality of holes extending through a base member of the substrate support; and a plurality of burl structures, wherein:
   each burl structure comprises a distal surface configured to contact, in use, a substrate being supported by the substrate support, and each burl structure comprises openings to at least two of the holes in the base member; and
   the substrate table is configured to provide an outward flow of fluid through all of the openings in each of one or more of the burl structures.
2. The substrate table of clause 1, wherein each burl structure comprises a burl recess extending from the distal surface to a recessed surface in the burl structure, the recessed surface comprising said openings to at least two of the holes in the base member.
3. The substrate table of clause 2, wherein each of one or more of the burl structures comprises a wall surrounding the burl recess in directions parallel to a plane of a supported substrate in use, a distal portion of the wall forming all or a portion of the distal surface that contacts the supported substrate in use, and/or wherein the base member further comprises a plurality of base recesses in the base member, wherein each base recess is aligned with a different respective one of the burl structures on an opposite side of the base member, the alignment being such that the outward flow of fluid is provided by driving a flow of fluid through the base recess and the burl recess of the respective burl structure via the holes in the base member, and/or wherein each of one or more of the burl structures comprises one or more sub-burls within the burl recess of the burl structure, each sub-burl having a distal tip forming a portion of the distal surface of the burl structure that contacts, in use, the substrate supported by the substrate support, the portion being less than all of the distal surface of the burl structure, and/or further comprising a porous layer upstream of the openings in each of at least one of the burl structures, and/or wherein the burl structures are formed in a burl formation member joined to the base member.
4. The substrate table of clause 4, wherein, for each of one or more of the burl structures, when viewed perpendicularly to a plane of the base member, a cross-sectional area of each hole opening into the recessed surface in the burl recess is smaller than a cross-sectional area of the respective base recess aligned with the burl structure and smaller than a cross-sectional area of the burl recess, or wherein:
   each of one or more of the burl structures comprises a wall surrounding the burl recess in directions parallel to a plane of a supported substrate in use, a distal portion of the wall forming a portion of the distal surface that contacts the supported substrate in use; and
   the distal tip of each of the sub-burls is spaced apart from the distal portion of the wall in all directions parallel to the plane of the supported substrate in use.
5. The substrate table of clause 4, wherein at least one of the holes formed through the base member passes through at least one of the sub-burls.
6. A lithographic apparatus comprising the substrate table of any preceding clause, the support table being configured to provide relative movement between a substrate and a projection system of the lithographic apparatus during exposure of the substrate in a lithography process performed by the lithographic apparatus.
7. A method of manufacturing a substrate support for a lithographic apparatus, comprising:
   forming a plurality of holes through a base member;
   joining a burl formation member to the base member after the holes have been formed in the base member; and
   forming a plurality of burl structures in the burl formation member, wherein the burl structures are formed such that:
   each burl structure comprises a distal surface configured to contact, in use, a substrate being supported by the substrate support, and each burl structure comprises an opening to at least one of the holes formed through the base member.
8. The method of clause 7, wherein the plurality of burl structures are formed in the burl formation member after the burl formation member has been joined to the base member, thereby forming the substrate support, and/or wherein:
  each burl structure comprises a burl recess extending from the distal surface to a recessed surface in the burl structure, the recessed surface comprising the opening to at least one of the holes formed through the base member; and
  the recessed surface comprises a surface of the base member.
9. A method of manufacturing a substrate support for a lithographic apparatus, comprising:
  forming a plurality of holes through a base member; and
  forming a plurality of burl structures in the base member after at least a portion of each of the plurality of holes has been formed in the base member, wherein the burl structures are formed such that:
    each burl structure comprises a distal surface configured to contact, in use, a substrate being supported, and
    each burl structure comprises an opening to at least one of the holes formed through the base member.
10. The method of clause 8 or 9, wherein each burl structure comprises a burl recess extending from the distal surface to a recessed surface in the burl structure, the recessed surface comprising said opening to at least one of the holes formed through the base member.
11. The method of clause 10, wherein each of one or more of the burl structures comprises a wall surrounding the burl recess in directions parallel to a plane of a supported substrate in use, a distal portion of the wall forming all or a portion of the distal surface that contacts the supported substrate in use, and/or further comprising forming a plurality of base recesses in the base member, wherein each base recess is positioned so as to be aligned with a different respective one of the burl structures on an opposite side of the base member, the alignment being such that a flow of fluid can be provided in use that passes through the base recess and the burl recess of the respective burl structure via one or more of the holes formed through the base member.
12. The method of clause 11, wherein, for each of one or more of the burl structures, when viewed perpendicularly to a plane of the base member, a cross-sectional area of each hole opening into the recessed surface in the burl recess is smaller than a cross-sectional area of the respective base recess aligned with the burl structure and smaller than a cross-sectional area of the burl recess.
13. The method of any of clauses 10-12, wherein the burl structures are formed by removing material from outside of the burl structures before removing material from inside of the burl structures to form the recessed surfaces, and/or wherein the recessed surface of each of one or more of the burl structures comprises openings to at least two of the holes formed through the base member, and/or wherein each of one or more of the burl structures comprises one or more sub-burls within the burl recess of the burl structure, each sub-burl having a distal tip forming a portion of the distal surface of the burl structure that contacts, in use, the substrate being supported by the substrate support, the portion being less than all of the distal surface of the burl structure, and/or further comprising applying a coating to the inside surfaces of the holes formed through the base member, and/or wherein the base recesses are formed before the burl structures, and/or comprising attaching the substrate support to a substrate table, the substrate table being configured to provide relative movement between the substrate and a projection system of a lithographic apparatus during exposure of the substrate in a lithography process.
14. The method of clause 13 when dependent on clause 11, wherein the distal tip of each of the sub-burls is spaced apart from the distal portion of the wall in all directions parallel to the plane of the supported substrate in use, and/or wherein at least one of the holes formed through the base member passes through at least one of the sub-burls.
15. The method of clause 14, wherein the coating is applied from a side of the base member opposite to where the burl structures are to be located.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:
1. A substrate table configured to support a substrate during a lithography process, the substrate table comprising:
  a substrate support comprising:
    a plurality of holes extending through a base member of the substrate support; and
    a plurality of burl structures, wherein:
      each burl structure comprises a distal surface configured to contact, in use, a substrate being supported by the substrate support, and each burl structure comprises openings to at least two of the holes in the base member; and
    the substrate table is configured to provide an outward flow of fluid through all of the openings in each of one or more of the burl structures.

2. The substrate table of claim 1, wherein each burl structure comprises a burl recess extending from the distal surface to a recessed surface in the burl structure, the recessed surface comprising the openings to at least two of the holes in the base member.

3. The substrate table of claim 2, wherein the base member further comprises a plurality of base recesses in the base member, wherein each base recess is aligned with a different respective one of the burl structures on an opposite side of the base member, the alignment being such that the outward flow of fluid is provided by driving a flow of fluid through the base recess and the burl recess of the respective burl structure via the holes in the base member.

4. The substrate table of claim 3, wherein, for each of one or more of the burl structures, when viewed perpendicularly to a plane of the base member, a cross-sectional area of each hole opening into the recessed surface in the burl recess is smaller than a cross-sectional area of the respective base recess aligned with the burl structure and smaller than a cross-sectional area of the burl recess.

5. The substrate table of claim 2, wherein each of one or more of the burl structures comprises a wall surrounding the burl recess in directions parallel to a plane of a supported substrate in use, a distal portion of the wall forming all or a portion of the distal surface that contacts the supported substrate in use.

6. The substrate table of claim 2, wherein each of one or more of the burl structures comprises one or more sub-burls within the burl recess of the burl structure, each sub-burl having a distal tip forming a portion of the distal surface of the burl structure that contacts, in use, the substrate supported by the substrate support, the portion being less than all of the distal surface of the burl structure.

7. The substrate table of claim 6, wherein:
each of one or more of the burl structures comprises a wall surrounding the burl recess in directions parallel to a plane of a supported substrate in use, a distal portion of the wall forming a portion of the distal surface that contacts the supported substrate in use; and
the distal tip of each of the sub-burls is spaced apart from the distal portion of the wall in all directions parallel to the plane of the supported substrate in use.

8. The substrate table of claim 6, wherein at least one of the holes formed through the base member passes through at least one of the sub-burls.

9. A lithographic apparatus comprising the substrate table of claim 1, the substrate table configured to provide relative movement between a substrate and a projection system of the lithographic apparatus during exposure of the substrate in a lithography process performed by the lithographic apparatus.

10. The substrate table of claim 1, further comprising a porous layer upstream of the openings in each of at least one of the burl structures.

11. The substrate table of claim 1, wherein the burl structures are formed in a burl formation member joined to the base member.

12. The substrate table of claim 1, wherein inside surfaces of the holes formed through the base member comprising a coating.

13. The substrate table of claim 1, wherein each distal surface is in the form of a ring shape.

14. A method of manufacturing the substrate support of claim 1, the method comprising:
forming a plurality of holes through the base member;
joining a burl formation member to the base member after the holes have been formed in the base member; and
forming the plurality of burl structures in the burl formation member, wherein the burl structures are formed such that:
each burl structure comprises a distal surface configured to contact, in use, a substrate being supported by the substrate support, and
each burl structure comprises an opening to at least one of the holes formed through the base member.

15. The method of claim 14, wherein the plurality of burl structures are formed in the burl formation member after the burl formation member has been joined to the base member, and/or
wherein:
each burl structure comprises a burl recess extending from the distal surface to a recessed surface in the burl structure, the recessed surface comprising the opening to at least one of the holes formed through the base member; and
the recessed surface comprises a surface of the base member.

16. The method of claim 15, wherein each burl structure comprises a burl recess extending from the distal surface to a recessed surface in the burl structure, the recessed surface comprising the opening to at least one of the holes formed through the base member.

17. The method of claim 16, further comprising forming a plurality of base recesses in the base member, wherein each base recess is positioned so as to be aligned with a different respective one of the burl structures on an opposite side of the base member, the alignment being such that a flow of fluid can be provided in use that passes through the base recess and the burl recess of the respective burl structure via one or more of the holes formed through the base member.

18. The method of claim 17, wherein, for each of one or more of the burl structures, when viewed perpendicularly to a plane of the base member, a cross-sectional area of each hole opening into the recessed surface in the burl recess is smaller than a cross-sectional area of the respective base recess aligned with the burl structure and smaller than a cross-sectional area of the burl recess.

19. The method of claim 16, wherein the burl structures are formed by removing material from outside of the burl structures before removing material from inside of the burl structures to form the recessed surfaces, and/or wherein the recessed surface of each of one or more of the burl structures comprises openings to at least two of the holes formed through the base member, and/or wherein each of one or more of the burl structures comprises one or more sub-burls within the burl recess of the burl structure, each sub-burl having a distal tip forming a portion of the distal surface of the burl structure that contacts, in use, the substrate being supported by the substrate support, the portion being less than all of the distal surface of the burl structure, and/or further comprising applying a coating to the inside surfaces of the holes formed through the base member, and/or wherein the base recesses are formed before the burl structures, and/or comprising attaching the substrate support to a substrate table, the substrate table being configured to provide relative movement between the substrate and a projection system of a lithographic apparatus during exposure of the substrate in a lithography process.

20. A method of manufacturing the substrate support of claim 1, the method comprising:
forming a plurality of holes through the base member; and
forming the plurality of burl structures in the base member after at least a portion of each of the plurality of holes has been formed in the base member, wherein the burl structures are formed such that:

each burl structure comprises a distal surface configured to contact, in use, a substrate being supported, and each burl structure comprises an opening to at least one of the holes formed through the base member.

\* \* \* \* \*